(12) United States Patent
Gerson

(10) Patent No.: US 6,809,250 B2
(45) Date of Patent: Oct. 26, 2004

(54) REPAIRED SOLAR PANEL AND METHOD OF PREPARING SAME

(75) Inventor: Reiner Gerson, Elmshorn (DE)

(73) Assignee: Astrium GmbH, Munich (DE)

( * ) Notice: Subject to any disclaimer, the term of this patent is extended or adjusted under 35 U.S.C. 154(b) by 0 days.

(21) Appl. No.: 10/326,273

(22) Filed: Dec. 23, 2002

(65) Prior Publication Data

US 2003/0196691 A1 Oct. 23, 2003

Related U.S. Application Data

(63) Continuation-in-part of application No. 10/214,729, filed on Aug. 9, 2002, now abandoned.

(30) Foreign Application Priority Data

Aug. 10, 2001 (DE) .......................... 101 30 441

(51) Int. Cl.[7] .......................... H01L 31/18; H01L 31/05; H01L 31/048
(52) U.S. Cl. ..................... 136/244; 136/251; 136/290; 136/249; 438/64; 438/66; 438/67; 438/80; 438/74; 257/433; 257/459
(58) Field of Search ................ 136/244, 251, 136/290, 249; 438/64, 66, 67, 80, 74; 257/433, 459

(56) References Cited

U.S. PATENT DOCUMENTS

| 4,057,439 | A | | 11/1977 | Lindmayer | 136/251 |
|---|---|---|---|---|---|
| 4,675,067 | A | | 6/1987 | Valley | 156/345.13 |
| 5,006,179 | A | * | 4/1991 | Gaddy | 136/244 |
| 5,021,099 | A | * | 6/1991 | Kim et al. | 136/249 |
| 5,118,361 | A | * | 6/1992 | Fraas et al. | 136/246 |
| 6,294,724 | B1 | * | 9/2001 | Sasaoka et al. | 136/251 |
| 6,617,505 | B2 | * | 9/2003 | Shimada | 136/244 |
| 2003/0029036 | A1 | * | 2/2003 | Gerson | 29/854 |
| 2004/0003840 | A1 | * | 1/2004 | Umemoto | 136/251 |

FOREIGN PATENT DOCUMENTS

| DE | 1 927 387 | | 5/1969 |
|---|---|---|---|
| DE | 2 113 410 | | 3/1971 |
| DE | 195 39 699 C2 | | 10/1995 |
| JP | 2003-17731 A | * | 1/2003 |

OTHER PUBLICATIONS

"Einsatz photovoltaischer Energiewandler" Von H. Brechna and Chr. Tanner; Technischie Rundschau No. 27, May 24, 1983, S. 17, 13, 21.

* cited by examiner

*Primary Examiner*—Alan Diamond
(74) *Attorney, Agent, or Firm*—Crowell & Moring L.L.P.

(57) ABSTRACT

In a method of repairing a solar panel having a defective solar cell or cells, a replacement cell (or cells) is glued onto a defective solar cell or cells of the solar panel, and is electrically integrated in the solar panel.

8 Claims, 2 Drawing Sheets

REPAIRED SOLAR PANEL AND METHOD OF PREPARING SAME

This application claims the priority of German patent document 101 30 441.1, filed Aug. 10, 2001, the disclosure of which is expressly incorporated by reference herein, and is a Continuation-In-Part of U.S. patent application Ser. No. 10/214,729, filed Aug. 9, 2002 now abandoned.

BACKGROUND AND SUMMARY OF THE INVENTION

The invention relates to a method for repairing solar a cell panel.

Heretofore, the repair of a solar cell panel with one or more defective solar cells, solar cell modules or solar cell strings has conventionally been accomplished by the complete removal and replacement of the defective cell or cells (sometimes referred to as a solar cell array), as described, for example, in German Patent Document DE 1 927 387. Moreover, German Patent Document DE 2 113 410 describes a repair-friendly arrangement of solar cells, in which a defective cell can easily be removed from a module or string of solar cells. Furthermore, German Patent Document DE 195 39 699 C2 describes the utilization of defective solar modules of a laminated construction, in which the solar cells are delaminated and the solar cell module is disassembled into its components. This state of the art in each case requires a relatively high-expenditure intrusion into the solar cell panel or into the solar cells, such that the resulting repaired solar cell panels may suffer damage.

The known repair methods according to the state of the art may, for example, require the following steps: The cover glass over the one or more solar cells is removed at the welding islands of the top "n-connectors" of the solar cells to permit them to be separated and carefully bent up, exposing connection webs directly behind the welds. Subsequently, the defective one or more solar cells is or are removed from the solar cell panel, the "p-connector" being retained on the panel. Then, one or more solar cells having a special repair connector are inserted into the repair site and the projecting n- and p-connectors are welded to the adjacent solar cells. Such separation of the defective solar cell or cells, which also requires high expenditures, may result in damage to the panel structure as well as to adjoining solar cells. Moreover, the use of such repaired solar cell panels with possible damage is problematic, particularly for applications of solar panels which, after being placed in service, allow no simple further repair of solar cells, as, for example, for aerospace applications. In addition, special repair connectors are required for repaired solar cell panels according to the state of the art and a new insulation foil must be provided.

It is an object of the present invention to provide a safe and effective method for repairing solar cell panels with defective solar cells, which does not have the disadvantages of the state of the art.

This and other objects and advantages are achieved by the method according to the invention, which is based on the proposition that one or more defective solar cells, or solar cell strings, solar cell modules or another defined group of defective solar cells, continue to be physically part of the solar cell panel, and that these defective solar cells are not removed from the panel structure. (In this case, the term "solar cells" includes a solar cell "assembly" (SCAs) consisting of the solar cell, the solar cell connector and cover glass.)

According to the invention, one or more replacement solar cells—also in the form of solar cell assemblies (SCAs)—are glued onto the defective solar cell or cells and are electrically integrated in the panel by means of the existing cut-open connectors. Therefore, either one defective solar cell may exist in the panel onto which the one or more intact replacement solar cells are glued, or several defective solar cells may be present which are directly adjoining, grouped or spatially separated (particularly in the form of entire solar cell strings or solar cell modules), onto which one or more intact replacement solar cells are glued. In cases in which complete defective solar cell strings, solar cell modules or other defined groups of solar cells are present, complete replacement solar cell strings or replacement solar cell modules can correspondingly be glued thereon.

The invention achieves a saving of components and materials. Another important advantage is a reduction of the repair time that is required for producing such repaired solar cell panels, because the time consuming separation of the defective solar cells is eliminated, only the connectors needing to be exposed.

A further embodiment of the invention provides that the one or more replacement solar cells are provided with standard-type n-connectors and p-connectors which are electrically connected (particularly welded) to cut-open connectors of one or more adjacent intact solar cells. The replacement solar cells may be glued on by means of a silicone glue.

Specifically, the present invention can be used in the case of solar cell panels that are constructed for aerospace applications (for example, solar cell panels for satellites or other spacecraft). In every case, the use of repaired solar cell panels will be more cost-effective than, for example, a complete elimination of solar cell panels because of some defective solar cells.

In order to apply the one or more replacement solar cells to the defective solar cell or the cells as described above, a protective cover foil can be used. For this purpose, the solar cell panel is covered by a Kapton foil with a window cut out adjacent the defective solar cell or cells. The window edges of the foil are preferably glued by means of adhesive tape, onto the adjacent intact solar cells in such a manner that the latter solar cells are protected by the foil during the repair operation. This process step is therefore advisable when special protection of the adjacent solar cells must be ensured.

Other objects, advantages and novel features of the present invention will become apparent from the following detailed description of the invention when considered in conjunction with the accompanying drawings.

DETAILED DESCRIPTION OF THE DRAWINGS

Figure 1:
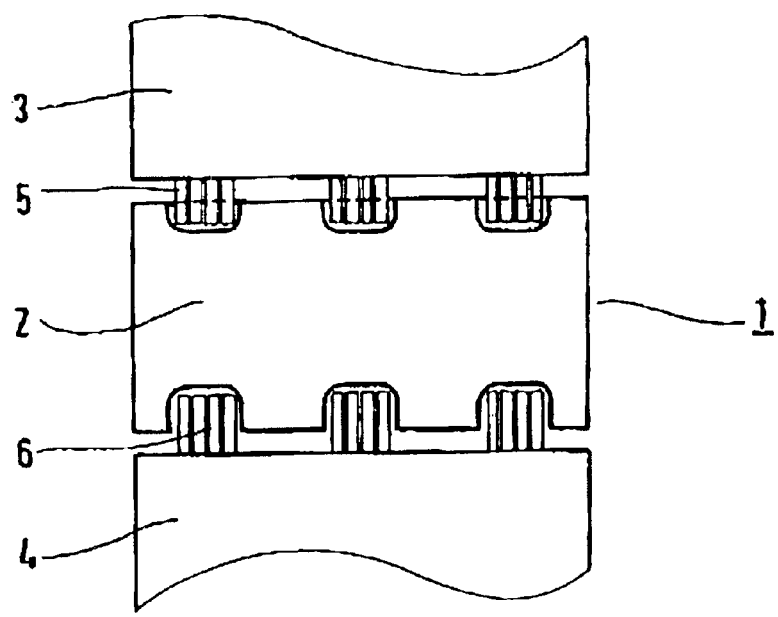
FIG. 1 is a broken away view of a cutout of a solar cell panel with a defective solar cell.

The broken away portion of a solar cell panel 1 illustrated in FIG. 1 shows a defective solar cell 2 and its electrical integration between two adjacent intact solar cells 3 and 4. Here, solar cells are particularly also solar cell assemblies (SCAs) consisting of a solar cell, a solar cell connector and cover glass. The electrical series connection of the solar cells takes place in a known manner by means of n-connectors 5 and p-connectors 6, several connectors in each case being combined to a welding island. (In the illustrated embodiment, these are 4 n- or p-connectors per welding island.) The solar cells illustrated in FIG. 1, for example, each have three welding islands for n- and p-connectors. However, instead of individual solar cells 2, 3, 4, a plurality of solar cells can also be provided in each case; for example, a complete solar cell module or a solar cell string or another defined grouped plurality of solar cells.

Figure 3:
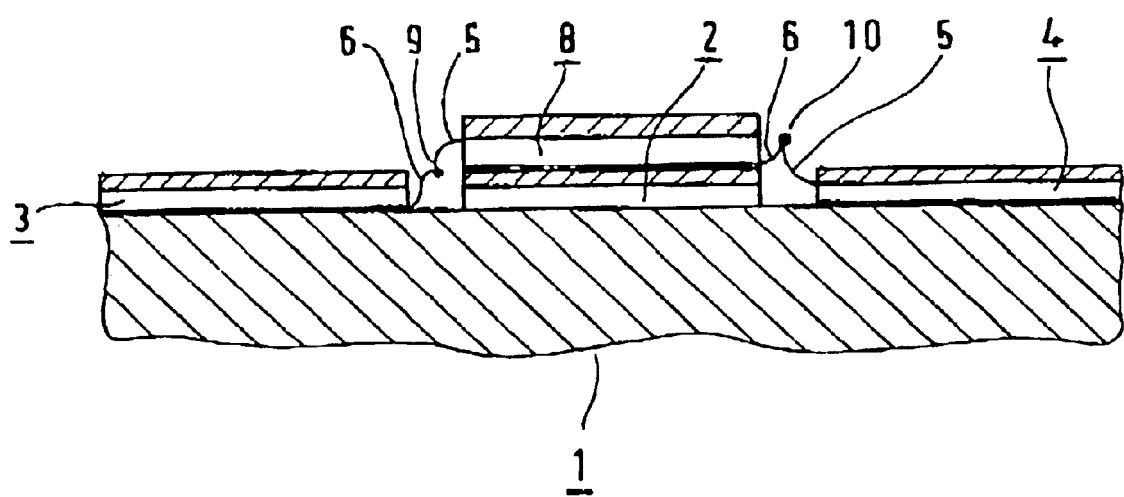
FIG. 3 is a broken away sectional view of a solar panel prepared according to the invention.

A repaired solar cell panel 1 corresponding to the present invention is illustrated in FIG. 3 and will be explained in greater detail hereinafter. Such a repaired solar cell panel 1 can then, for example, be produced as follows:

First, the solar cell panel 1 is covered by means of a Kapton foil which is cut out over the defective solar cell or cells 2. The window edges of the Kapton foil are glued, for example, by means of an adhesive tape onto the adjacent intact solar cells 3, 4. Subsequently, the n- and p-connectors are exposed at the defective solar cell or cells 2. For this purpose, for example, the cover glass 7 can be partially removed over the welding islands of the n-connectors 5. In this case, on the welding islands of the p-connectors 6, the defective solar cell or cells 2 may be partially removed, starting from the cover glass down to the p-connectors 6 in the area of the welding islands. The webs of the exposed n- and p-connectors are separated and bent up.

Figure 2:
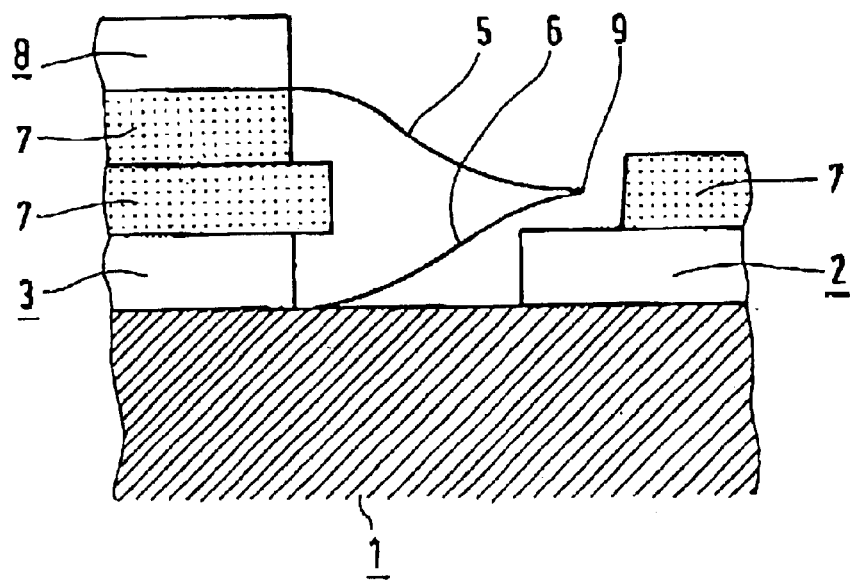
FIG. 2 is a broken away sectional view of a cutout of the solar cell panel in FIG. 1, with a replacement solar cell prepared for priming.

At the repair site prepared in this manner, preferably the one or more replacement solar cells or replacement SCAs 8 may then be deposited (upside down, as shown in FIG. 2) with their cover glass 7 first on the cover glass of adjacent intact solar cells 3 or 4, and temporarily fixed there by means of an adhesive tape.

The replacement solar cells 8 are provided with standard-type n- and p-connectors. The n-connectors 5 (for example) of the replacement solar cells or replacement SCAs 8 are connected with the p-connectors 6 of intact solar cells (in FIG. 2, for example, solar cell 3) by means of a spot weld 9.

Subsequently, the p-side of the replacement solar cells or replacement SCAs 8 and the surface of the cover glass 7 of the defective one or several solar cells 2 is primed; that is, a pretreatment takes place by means of a primer. After the primer has evaporated, a bonding agent is applied to the primed surface of the defective solar cell or solar cells 2. The bonding agent may, for example, be a silicone bonding agent, such as a silicone rubber. A special example of such a silicone rubber is the product "RTV-S691" of Wacker Co.

The one or more replacement solar cells 8 are then turned over and placed by means of the p-side onto the defective solar cell or cells 2 and aligned there. After the hardening of the bonding agent, the p-connectors 6 of the replacement solar cell or cells 8 are connected with the n-connectors 5 of another adjacent intact solar cell 4 by way of a weld point 10.

FIG. 3 shows a repaired solar cell panel 1 according to the invention, as obtained particularly as a result of an above-described repair operation. One or more replacement solar cells or replacement SCAs 8 are glued by means of a silicone bonding agent onto one or more defective solar cells or SCAs 2, and the n- and p-connectors 5 and 6 of the one or several replacement solar cells or replacement SCAs 8 are correspondingly connected with the p- and n-connectors 5 and 6 of the adjacent intact solar cells 3, 4 by way of weld points 9, 10. The repaired solar cell panel 1 as well as the other intact solar cells 3, 4 suffer no damage such as may occur in the known repair processes. The repair site in the area of the defective solar cell or cells 2 represents virtually no impairment of the functionality of the solar cell panel 1.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method of repairing a solar panel comprising a plurality of mutually electrically connected solar cells, said method comprising:

gluing at least one replacement solar cell onto at least one defective solar cell of the solar panel; and electrically connecting the glued on at least one replacement solar cell to the solar panel.

2. The method according to claim 1, wherein the at least one replacement solar cell includes standard n-connectors and p-connectors; and said electrically connecting comprises welding the n- and p-connectors of the at least one replacement solar cell to cut-open connectors of adjacent intact solar cells.

3. The method according to claim 1, wherein silicone bonding agent is used for gluing on the at least one replacement solar cell.

4. The method according to claim 1, wherein a protective cover foil is first applied to solar cells adjoining the at least one defective solar cell.

5. A method for repairing a solar panel comprising a matrix of individual solar cells, each having a plurality of n-connectors and p-connectors and being covered by a layer of cover glass, said method comprising:

removing the cover glass adjacent welding islands of n- and p-connectors for a defective solar cell group, comprising at least on solar cell, in said solar panel;

gluing a replacement solar cell group, comprising at least on solar cell, onto the defective solar cell group; and electrically connecting connectors of the replacement solar cell group to connectors of solar cells in said panel adjacent said defective solar cell group.

6. The method according to claim 5, wherein:

said defective solar cell group comprises a plurality of solar cells; and said replacement solar cell group comprises a plurality of solar cells.

7. A method for repairing a solar panel comprising a matrix of individual solar cells, each having a plurality of n-connectors and p-connectors and being covered by a layer of cover glass, said method comprising:

removing the cover glass adjacent welding islands of n- and p-connectors for a defective solar cell group, comprising at least on solar cell, in said solar panel, whereby said connectors are exposed;

cutting the exposed connectors for said defective solar cell group and bending them upwards;

placing a replacement solar cell group upside down adjacent the defective solar cell group, comprising at least on solar cell,;

connecting exposed n- or p- connectors on the replacement solar cell group to connectors on a first solar cell adjacent the defective solar cell group;

folding the replacement solar cell group over and bonding it to unremoved glass covering the defective solar cell group; and connecting remaining exposed connectors of said replacement solar cell group to connectors of a second solar cell adjacent the defective solar cell group.

8. The method according to claim 7, wherein
said defective solar cell group comprises a plurality of solar cells; and
said replacement solar cell group comprises a plurality of solar cells.

* * * * *